United States Patent
Le Goascoz et al.

(10) Patent No.: US 7,029,991 B2
(45) Date of Patent: Apr. 18, 2006

(54) METHOD FOR MAKING A SOI SEMICONDUCTOR SUBSTRATE WITH THIN ACTIVE SEMICONDUCTOR LAYER

(75) Inventors: Vincent Le Goascoz, Claix (FR); Herve Jaouen, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 74 days.

(21) Appl. No.: 10/312,024

(22) PCT Filed: Jun. 21, 2001

(86) PCT No.: PCT/FR01/01960

§ 371 (c)(1),
(2), (4) Date: Aug. 1, 2003

(87) PCT Pub. No.: WO01/99179

PCT Pub. Date: Dec. 27, 2001

(65) Prior Publication Data

US 2004/0029325 A1    Feb. 12, 2004

(30) Foreign Application Priority Data

Jun. 23, 2000  (FR) .................................. 00 08094

(51) Int. Cl.
*H01L 21/322* (2006.01)

(52) U.S. Cl. ..................................... 438/471; 438/480
(58) Field of Classification Search ................. 438/58, 438/143, 310, 402, 403, 404, 406, 455, 471, 438/473, 479, 480, 766
See application file for complete search history.

(56) References Cited

U.S. PATENT DOCUMENTS 5,589,407 A * 12/1996 Meyyappan et al. ........ 438/766

* cited by examiner

*Primary Examiner*—Hoai Pham
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The invention concerns a method comprising: 1) a first phase including steps which consist in forming in the upper part of a first initial semiconductor substrate a first layer of insulating material above a sectional plane of said first substrate, contacting the first layer of insulating material with the insulating upper part of a second initial substrate, so as to form a single layer of insulating material, a break at the sectional plane, so as to obtain an intermediate semiconductor substrate on the single insulating material layer; then, 2) in a second phase which consists in forming in the intermediate semiconductor substrate an additional insulating material layer adjacent to the single insulating material and topped with an upper layer of a final semiconductor substrate.

20 Claims, 5 Drawing Sheets

FIG_1
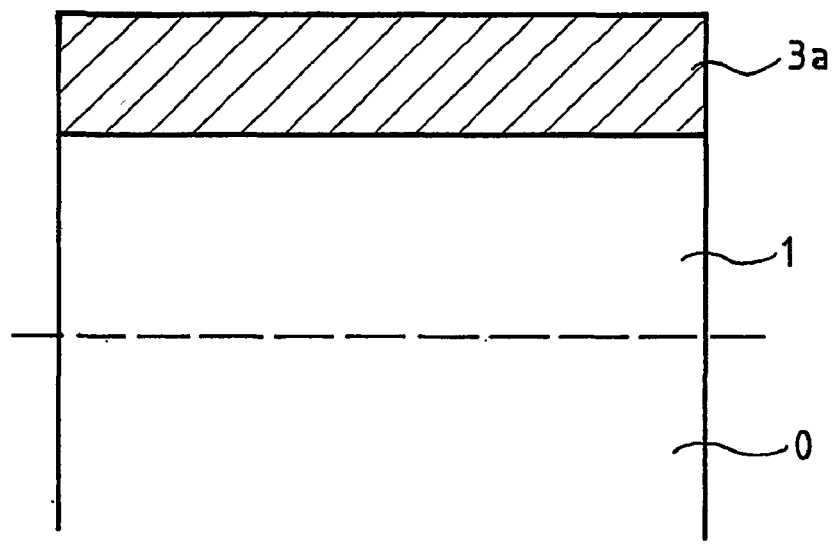
FIG_2
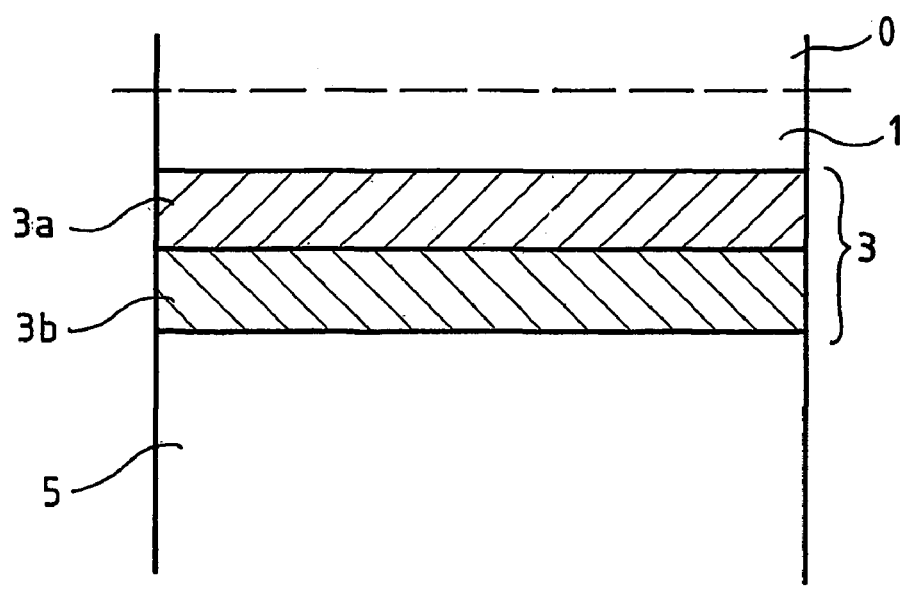

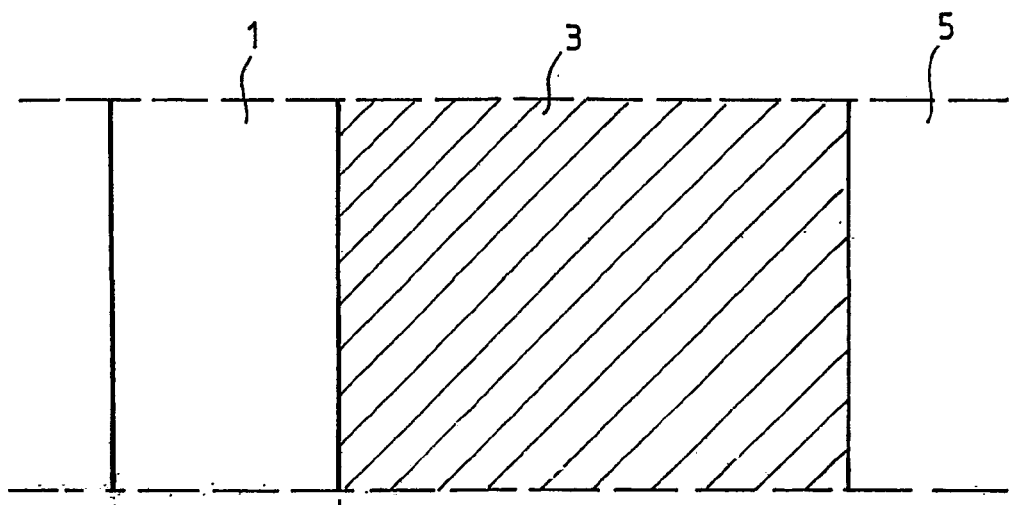
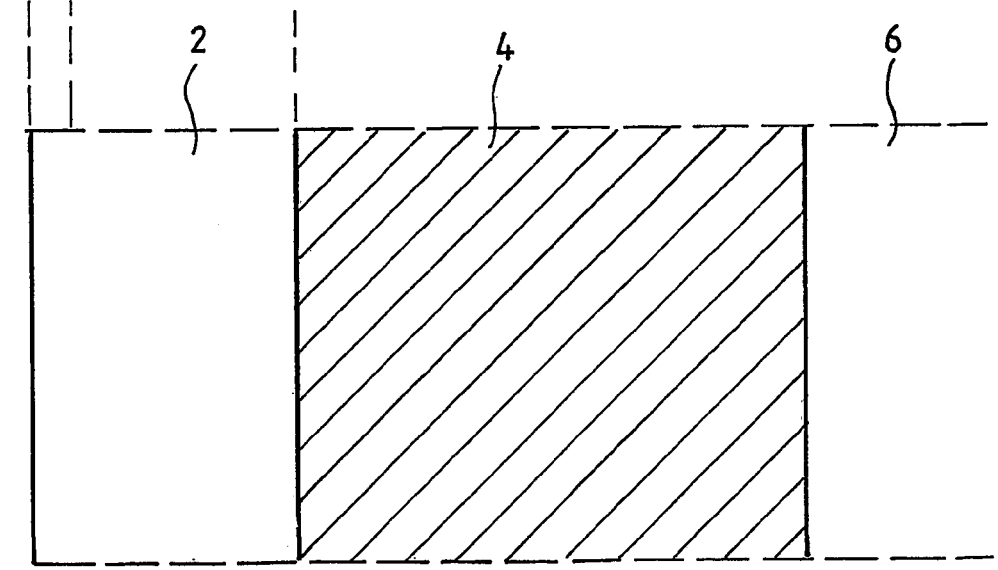

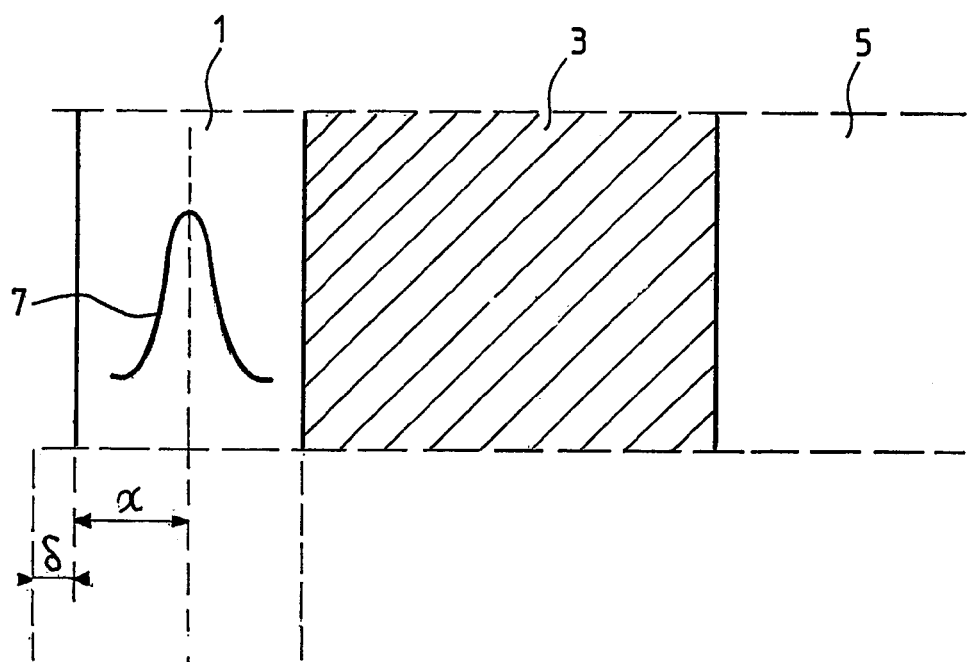
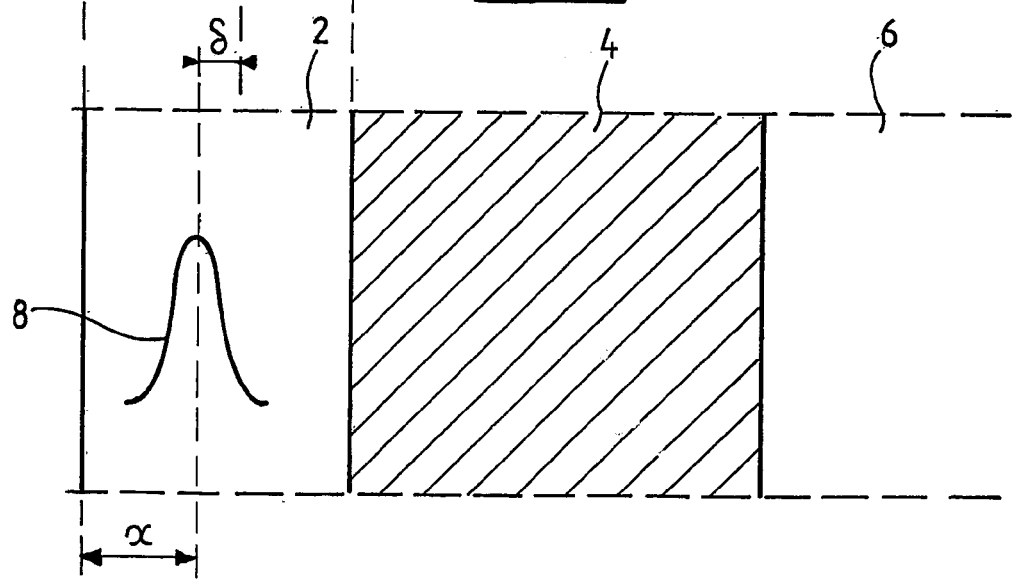

FIG_7
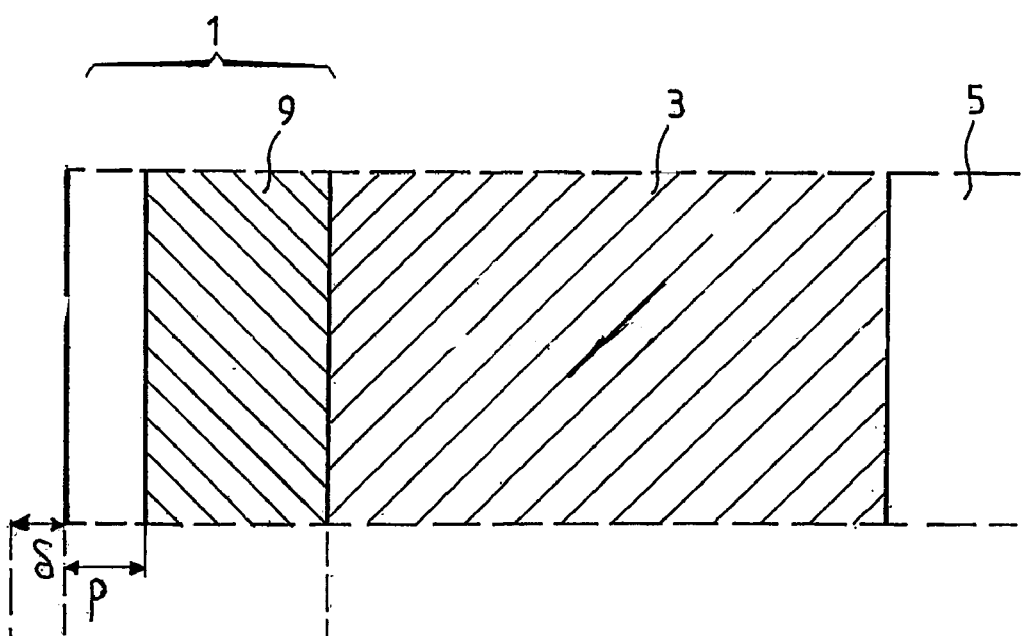
FIG_8
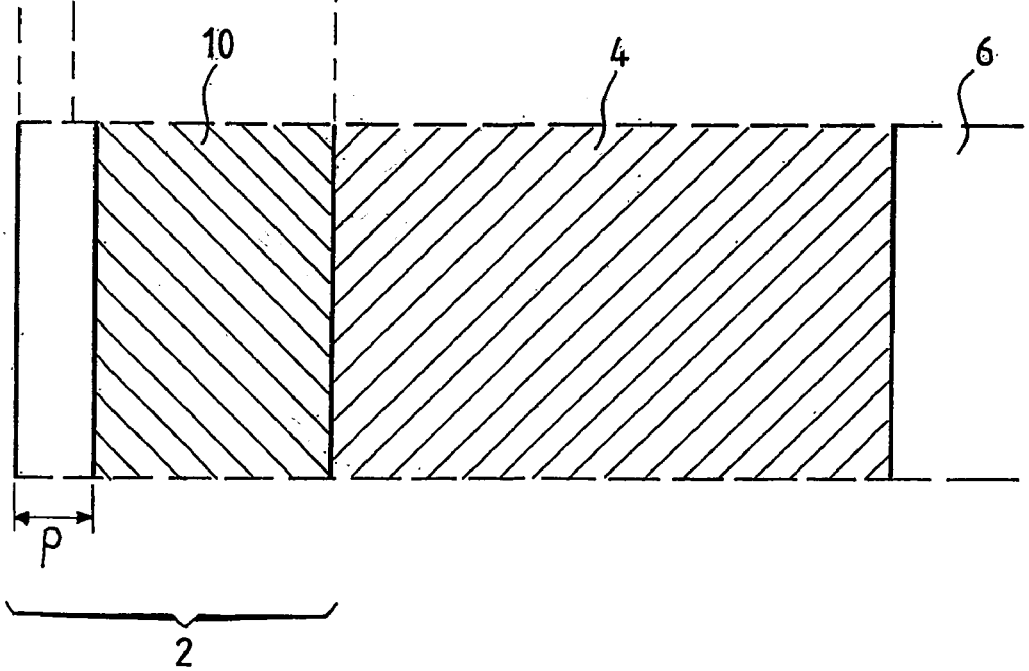

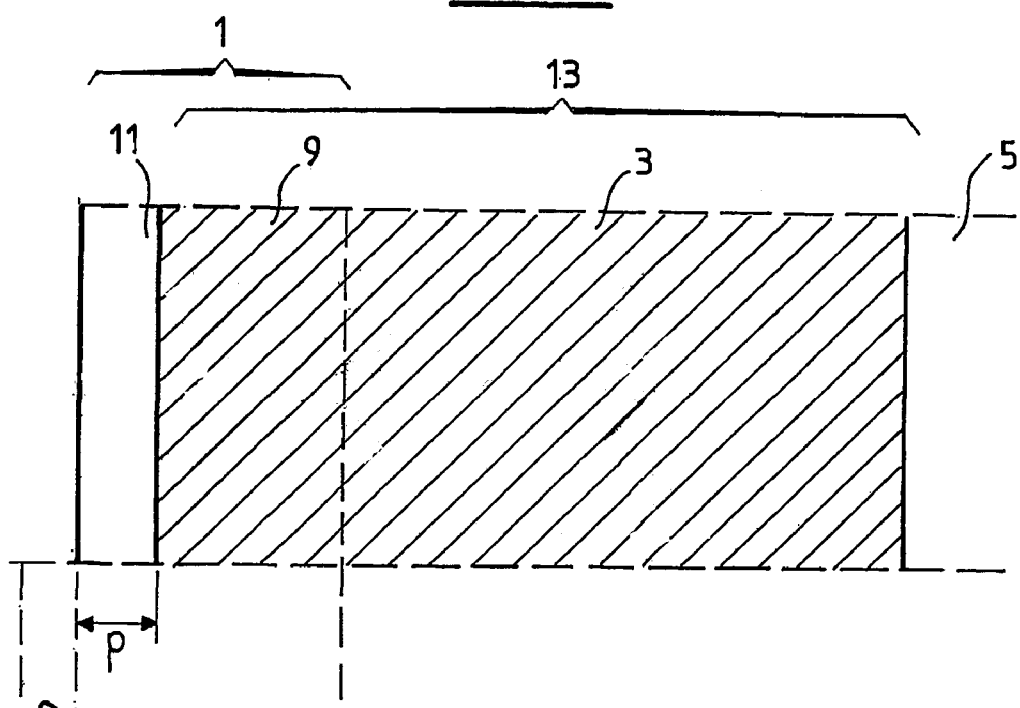
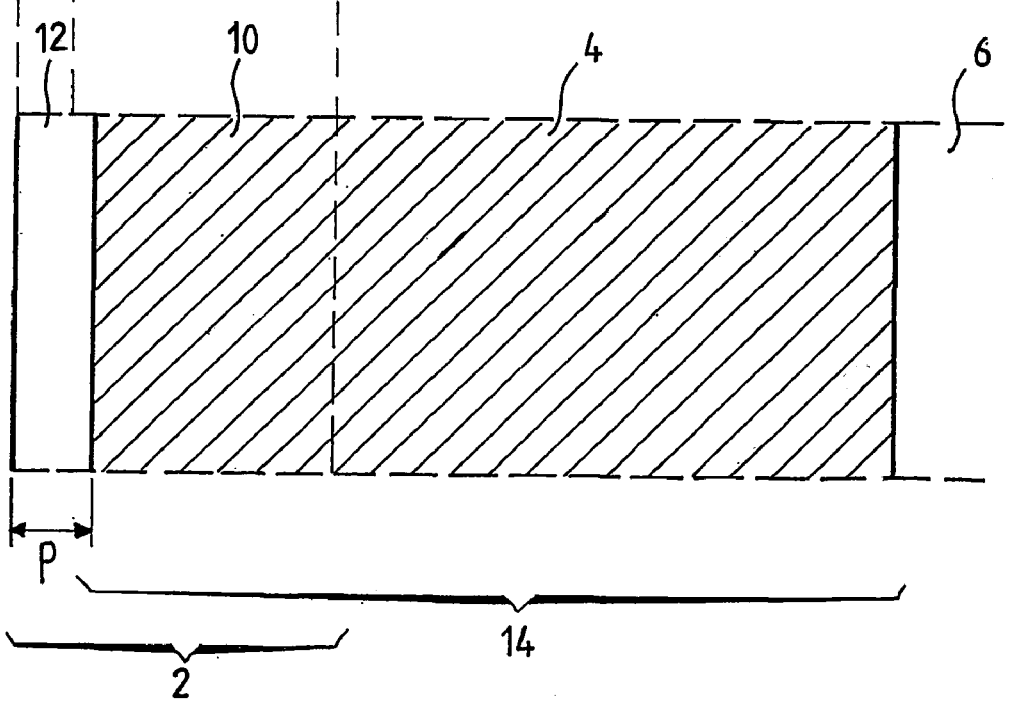

METHOD FOR MAKING A SOI SEMICONDUCTOR SUBSTRATE WITH THIN ACTIVE SEMICONDUCTOR LAYER

CROSS-REFERENCE TO RELATED APPLICATIONS

This application is based upon and claims priority from prior PCT Application PCT-FR01-01960 filed on Jun. 21, 2001, which claims priority on prior French Patent Application No. 0008094 Filed on Jun. 23, 2000 the entire disclosure of both applications which are hereby incorporated by reference in there entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISK

Not Applicable

BACKGROUND OF THE INVENTION (1) Field of the Invention

The present invention relates in general to integrated circuits and more particularly to the manufacture of a device of the SOI (Silicon On Insulator) type comprising a layer of semiconductor material on a layer of insulating material.

(2) Description of the Related Art

The manufacture of SOI (Silicon On Insulator) devices comprising a layer of semiconductor material on a layer of insulating material is known. These SOI-type devices are more particularly intended to be used for producing devices of the type which are fully depleted of charge carriers in the channel region, also called fully-depleted devices, in which the thickness of the silicon-containing semiconductor substrate, also called the active layer, defines inter alia the threshold voltage of MOS-type transistors and is of great importance.

A major difficulty in the use of fully-depleted assemblies is how to produce thin layers of silicon-containing semiconductor substrate, on a layer of an insulating material with good control and sufficient reproducibility of the thickness of this active layer between two different manufacturing batches.

To perform properly, fully-depleted structures require active layers with a thickness of about 5 to 30 nanometers depending on the threshold voltage that it is desired to obtain and on the transistor gate dimensions. For example, for 0.1 µm technology, the ideal silicon thickness is about 15 nm for a threshold voltage of around 0.35 volts. Any deviation from planarity of the active layer and any difference in thickness of the active layer between two manufacturing batches result in a corresponding variation in the threshold voltage. In general, on any given active layer, the deviation from planarity is small (about a few percent), but from one batch to another the difference in thickness may be much greater.

The known techniques for fabricating SOI-type devices all have a number of drawbacks, particularly a low production yield, the formation of relatively thick active layers, of mediocre uniformity and difficult to reproduce from one assembly to another, and consequently having a threshold voltage that cannot be easily controlled.

One first SOI-type device fabrication process, known as "SIMOX" technology, consists in forming an $SiO_2$ layer buried in a silicon substrate by a step of high-dose oxygen implantation followed by annealing at a temperature above 1300° C. The drawbacks of this process are in particular the high cost of fabricating the trenches, the crystal defects generated in the silicon layer by high-dose, high-energy oxygen implantation, the small thickness of the buried insulation layer and the defects (holes) within the buried insulation layer.

Finally, this process, because the thicknesses of the silicon and buried silicon oxide layers are determined by the implantation process, that is to say a massive implantation of oxygen at high energy and with a high dose, makes it difficult to achieve thicknesses of less than 50 nm in the case of the thin residual silicon layer.

A second process, known as "BESOI" technique consists in producing an SOI-type device by forming, on a surface of a first silicon substrate, a thin $SiO_2$ film, joining this first substrate, via the thin $SiO_2$ film, to a second silicon substrate and finally removing, by mechanical grinding and polishing, part of one of the silicon substrates in order to form a thin silicon layer above the buried silicon oxide layer. The silicon oxide layer on the first silicon substrate is formed by a succession of steps which are: oxidation of the surface of this first substrate and then the etching of the oxide layer formed in order to obtain the desired thickness.

This process makes it possible to obtain only buried silicon oxide layers and silicon layers on the buried silicon oxide which are relatively thick because of the poor control of the etching process. Furthermore, the thin layers obtained by this process have poor uniformity as a result of the use of mechanical steps which in general generate ups and downs on the surface of the active layer.

A third process, known as "SMARTCUT" technology, consists in forming a thin silicon oxide layer by oxidation on a first silicon substrate and then implanting, under the thin silicon oxide layer, $H^+$ ions into this first silicon substrate in order to form, within it, a plane of cavities. Next, this first substrate is bonded to a second pre-oxidized silicon substrate via the thin silicon oxide layer. The assembly thus formed is then heat treated for the purpose of converting the plane of cavities into a splitting plane.

This process makes it possible to recover, on the one hand, an SOI assembly and, on the other hand, a reusable silicon substrate and it requires the implantation of a high dose of hydrogen atoms. Despite the use of hydrogen atoms which are smaller in size than the oxygen atoms of the SIMOX process, the surface of the thin silicon layer obtained is also damaged. Furthermore, the use of this technique does not in general make it possible to obtain thin silicon layer thicknesses of less than approximately 50 nm. In the SOI assemblies thus obtained, the thickness of the silicon active layer formed is determined by the hydrogen implantation, allowing the initial substrate to be cut and this layer then to be finely polished. The deviation from planarity caused by this process is approximately 5 nm, whatever the thickness of the final layer. It therefore becomes a major drawback for thicknesses of less than 50 nm. In addition, the variation in thickness from one wafer to another may be about 25% to 40% of the mean thickness of a batch of wafers, for example in the case of nominal thicknesses of less than 50 nm, thereby constituting a major handicap when producing complex circuits because of the difference in threshold voltage resulting from the difference in thickness.

The above processes are described, in particular, in the article "SOI: Materials to Systems (by A. J. Auberton-Hervé, IEEE, 1996.

According, a need exist to provide a process for fabricating an SOI-type device which overcomes the drawbacks of the processes of the prior art.

BRIEF SUMMARY OF THE INVENTION

In particular, the present invention provides a process for fabricating an SOI assembly which makes it possible to obtain silicon-containing semiconductor substrates, resting on a layer of insulating material, which are very thin, including for thicknesses of insulated semiconductor of less than 50 nm, are of very good uniformity and have very good reproducibility, from an SOI-type device comprising a layer of semiconductor material on a layer of insulating material.

According to one aspect of the invention, this process for fabricating a device of the Silicon-On-Insulator (SOI) type, comprising a layer of semiconductor material on a layer of insulating material, comprises
1) a first phase comprising the following steps:
    a) formation in the upper part of a first initial semiconductor substrate of a first layer of insulating material on top of a splitting plane of this first substrate,
    b) contacting of the first layer of insulating material with the insulating upper part of a second initial substrate so as to form a single layer of insulating material and
    c) cutting, in the splitting plane, so as to obtain an intermediate semiconductor substrate on the single layer of insulating material; and then
2) a second phase comprising the formation in the intermediate semiconductor substrate of an additional layer of insulating material contiguous with the single layer of insulating material and surmounted by an upper layer of final semiconductor substrate.

During the first phase of the process, the splitting plane may be formed before or after the first layer of insulating material. This first layer of insulating material may be especially formed by oxidation, nitriding or deposition. The second initial substrate may be of any electrical type. If it is insulating, for example made of glass, it will thus not be necessary to form an insulating upper part. If the second initial substrate is a semiconductor, the insulating upper part could be especially formed by oxidation, nitriding or deposition.

One of the advantages of the proposed process is that the implantation of the species serving to generate the additional layer of insulating material adjoining the single layer of insulating material makes it possible to position, accurately and completely reproducibly, the desired species with respect to the surface via which the ion beam enters the intermediate semiconductor substrate. The only variation caused by this process is a variation in the position of the implanted species, which depends only on the implanted species and on the implantation energy used. The position of the species implanted into the intermediate semiconductor substrate therefore does not depend on the thickness of this substrate but only on the implantation energy for a given species being implanted.

Since the implantation energy is relatively simple to control, it thus becomes extremely easy to control the depth of implantation of the ion species. The reproducibility of the process stems from the fact that all implantations, for a given species and for a given energy, will take place at the same depth, therefore making it possible to obtain an upper layer of final semiconductor substrate which is perfectly reproducible, whatever the difference in thickness of the intermediate semiconductor substrates of different initial SOI-type devices subjected to the implantation.

This technique therefore improved control of the active layer thickness, with remarkable reproducibility and extreme reliability.

The invention is also noteworthy in that it uses, in the first phase, a phase of the "SMARTCUT technology" type and in that it makes it possible to remedy the principal drawback of this technique (the impossibility of obtaining particularly small thicknesses of the silicon substrate, and the substantial scatter in the thicknesses obtained) by combining it with the second phase of forming an additional insulating layer.

Preferably, the formation in the intermediate semiconductor substrate of this additional layer of insulating material is produced by means of oxygen and/or nitrogen implantation into the intermediate semiconductor substrate followed by a heat treatment.

According to a preferred method of implementing the invention, the oxygen and/or nitrogen implantation is carried out at an energy of greater than 2 keV.

Preferably, the oxygen and/or nitrogen implantation is carried out with doses of between $10^{16}$ atoms/cm$^2$ and $10^{20}$ atoms/cm$^2$.

According to a preferred method of implementing the invention, the thickness of the layer of final semiconductor substrate is greater than 5 nm and is more particularly between 5 nm and 30 nm.

Because of the oxygen and/or nitrogen atom implantation within the thick silicon-containing semiconductor substrate of the initial SOI assembly, the additional layer of insulating material comprises silicon oxide and/or silicon nitride.

Preferably, the first initial semiconductor substrate comprises single-crystal pure silicon, germanium, silicon-germanium alloys of the $Si_{1}-x-Ge_x$ type (where $0<x<1$) or carbon-containing silicon-germanium alloys of the $Si_{1-x-y}Ge_xC_y$ type (where $0<x<0.95$ and $0<y<0.95$).

The invention also relates to an integrated circuit comprising an SOI-type device obtained by the process described above.

This electronic circuit may comprise at least one electronic component chosen from the following list: high-voltage or power diode, transistor, capacitor.

The foregoing and other features and advantages of the present invention will be apparent from the following more particular description of the preferred embodiments of the invention, as illustrated in the accompanying drawings.

BRIEF DESCRIPTION OF THE DRAWINGS

Further advantages and features of the invention will become apparent on examining the detailed description of an entirely non-limiting method of implementing the process of the invention, illustrated by FIGS. 1 to 10, FIGS. 1 and 2 are cross-sectional views of the SOI-type device during the first phase of a method of implementing the process of the invention; and FIGS. 3 to 10 are cross-sectional views of the SOI-type device during the second phase of a method of implementing the process of the invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

FIG. 1 shows a first initial semiconductor substrate 0. This first initial semiconductor substrate may comprise any type of semiconductor material, and may especially comprise single-crystal silicon, germanium, alloys, $Si_{1-x}Ge_x$ silicon alloys (where 0<x<1) or $Si_{1-x-y}Ge_xC_y$ silicon alloys (where 0<x<0.95 and 0<y<0.95).

In this first initial semiconductor substrate 0, a splitting plane is formed, for example by $H^+$ ion implantation, said plane being represented by the dotted line in the figure and defining a layer 1 in the first initial semiconductor substrate 0. The upper part of the first initial semiconductor substrate 0 is then oxidized to form a first layer of insulating material 3a on top of the splitting plane.

Likewise, the upper part of a second initial semiconductor substrate 5 is oxidized to form a second layer of insulating material 3b. The two initial semiconductor substrates are then brought into contact with each other via their layer of insulating material 3a and 3b in order to form a single layer of insulating material, as illustrated in FIG. 2.

A cutting operation is then carried out in the splitting plane so as to obtain an intermediate semiconductor substrate on the single layer of insulating material 3. Next, a chemical-mechanical polishing operation is carried out on the upper surface of the intermediate semiconductor substrate so as to remove the defects generated by the ion implantation.

FIG. 3 illustrates the SOI-type device at the end of the first phase of the process. This device comprises the intermediate semiconductor substrate 1 on the single layer of insulating material 3, which layer rests on the second initial semiconductor substrate 5. The first phase of the process is consequently a "SMARTCUT technology" type phase.

FIG. 4 also illustrates an SOI-type device at the end of the first phase of the process, the device comprising the intermediate semiconductor substrate 2 on the single layer of insulating material 4, which layer rests on the second initial semiconductor substrate 6.

The devices in FIGS. 3 and 4, although obtained by the same phase of the process, have different thicknesses of the intermediate semiconductor substrates 1 and 2. The difference in thickness between the intermediate semiconductor substrates 1 and 2 is depicted in the figures by the distance δ.

Starting from these assemblies, and in accordance with the second phase of the process, the species serving to generate the additional layer of insulating material is implanted within the intermediate semiconductor substrates 1 and 2, the species being chosen from oxygen and/or nitrogen.

FIGS. 5 and 6 illustrate the profile of the implantation peaks 7 and 8 of the desired species within the intermediate semiconductor substrates 1 and 2. These implantation peaks 7 and 8 are positioned according to the process at the same depth x in the substrate whatever the thickness of the intermediate semiconductor substrates 1 and 2. The peaks 7 and 8 are therefore implanted in the substrates 1 and 2 with a difference in depth δ with respect to the layers of single insulating material 3 and 4. These nitrogen and/or oxygen atoms are preferably implanted with doses of between $10^{16}$ atoms/cm$^2$ and $10^{20}$ atoms/cm$^2$ at an energy of greater than 2 keV. The lowest energy is used for large thicknesses of the semiconductor substrate of around 50 nm and may reach several hundreds of keV in the case of thicknesses of around 500 nm. These relatively high doses and these energies furthermore allow the implantation peaks 7 and 8 to be accurately positioned in the intermediate semiconductor substrates 1 and 2.

Once the implantation has been carried out, the implanted species is activated so as to create an additional layer of insulating material by making the implanted species react with the species of which the substrates 1 and 2 are composed. In general, the implanted species is oxygen and/or nitrogen. The layer of additional insulating material thus formed will therefore consist of silicon oxide and/or silicon nitride. Preferably, the activation step will comprise a heat treatment on the assembly thus formed.

FIGS. 7 and 8 illustrate the profile of the layers of additional insulating material 9 and 10 which are obtained after heat treatment. The heat treatment makes it possible to form the additional layers of insulating material 9 and 10 in the intermediate semiconductor substrates 1 and 2. These additional layers of insulating material 9 and 10 are produced in the same way and with identical implantation parameters, they are therefore formed at the same depth P in the intermediate semiconductor substrates 1 and 2.

FIGS. 9 and 10 illustrate a cross-sectional view of the SOI-type devices obtained at the end of the second phase of the process and show the formation of the final semiconductor substrates 11 and 12 from the initial semiconductor substrates 1 and 2, these final semiconductor substrates 11 and 12 having a thickness P greater than 5 nm and preferably between 5 nm and 30 nm, the said final semiconductor substrates 11 and 12 having the same thickness P for both assemblies used.

Thus, two SOI-type devices each comprising a final semiconductor substrate, 11 and 12 respectively, and preferably consisting of silicon, resting on a layer of an insulating material, 13 and 14 respectively, are obtained, the said layer of insulating material being composed of the single layer of insulating material, 3 and 4 respectively, and of the additional layer of insulating material, 7 and 8 respectively, the two assemblies having the same thickness P of final semiconductor substrate, 11 and 12 respectively.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

The substrates thus obtained are therefore completely reproducible and particularly suitable for being used to produce fully-depleted devices.

What is claimed is:

1. A process for fabricating two or more silicon-on-insulator (SOI) type semiconductor substrates, wherein each of the substrates include a semiconductor active layer, the process comprising the steps of:

forming an insulating layer on top of a support layer;

forming a silicon-containing semiconductor substrate with a given thickness on top of the insulating layer;

forming both an insulation layer within the silicon-containing semiconductor substrate, and a residual layer of silicon-containing semiconductor on top of the silicon-containing semiconductor substrate, by performing the steps of:

implanting at least one of nitrogen and oxygen atoms at a predetermined depth in the given thickness of the silicon-containing semiconductor substrate; and activating at least one of nitrogen and oxygen atoms through heat to create a layer of insulating, material within the silicon-containing semiconductor substrate and to create a residual layer of silicon-containing semiconductor through the reaction with the silicon-containing semiconductor substrate thereby creating the residual layer of silicon-containing semiconductor with a predetermined thickness.

2. The process according to claim 1, wherein the step of forming an insulating layer includes forming an insulating layer comprised of silicon oxide.

3. The process according to claim 1, wherein the step of forming an insulating layer includes forming an insulating layer on top of a support layer comprised of at least one of silicon and silicon alloy.

4. The process according to claim 1, wherein in the step of implanting at least one of nitrogen and oxygen atoms includes implanting both nitrogen and oxygen atoms.

5. The process according to claim 4, wherein the step of implanting at least one of nitrogen and oxygen atoms includes implanting at least one of nitrogen and oxygen atoms with an energy of between a 1 keV and 50 keV.

6. The process according to claim 1, wherein the step of activating at least one of nitrogen and oxygen atoms through heat to create a layer of insulating material within the silicon-containing semiconductor substrate includes creating an insulating material consisting of at least one of silicon nitride and silicon oxide.

7. The process according to claim 6, wherein the step of activating the at least one of nitrogen and oxygen atoms through heat to create a layer of insulating material within the silicon-containing semiconductor substrate and to create the residual layer of silicon-containing semiconductor through the reaction with the silicon-containing semiconductor substrate thereby creating the residual layer of silicon-containing semiconductor with a predetermined thickness of between 5 nm to 30 nm.

8. The process according to claim 6, wherein the step of forming a silicon-containing semiconductor substrate with a given thickness on top of the insulating layer includes forming a silicon-containing layer using SIMOX technology.

9. The process according to claim 1, wherein the step of activating at least one of nitrogen and oxygen atoms through heat to create a layer of insulating material within the silicon-containing semiconductor substrate and to create the residual layer of silicon-containing semiconductor through the reaction with the silicon-containing semiconductor substrate thereby creating the residual layer of silicon-containing semiconductor with a predetermined thickness of between 5 nm to 100 nm.

10. The process according to claim 1, wherein the step of forming a silicon-containing semiconductor substrate with a given thickness on top of the insulating layer includes forming a silicon-containing semiconductor substrate comprising a single-crystal silicon, polycrystalline silicon, $Si_{1-x}Ge_x$ silicon alloys, where 0<x 1 or $Si_{1-x-y}Ge_xC_y$ silicon alloys, where 0<x<0.95 and 0<y<0.95.

11. The process according to claim 1, wherein the step of forming a silicon-containing semiconductor substrate with a given thickness on top of the insulating layer includes forming a silicon-containing layer using SMARTCUT technology.

12. The process according to claim 1, wherein the step of implanting at least one of nitrogen and oxygen atoms includes implanting at least one of nitrogen and oxygen atoms with doses of between $10^{17}$ atoms/cm$^2$ and $10^{20}$ atoms/cm$^2$.

13. The process according to claim 1, wherein the step of activating the at least one of nitrogen and oxygen atoms through heat includes activating the at least one of nitrogen or oxygen atoms through annealing.

14. A process for fabricating an assembly comprising a silicon-containing semiconductor substrate with a layer of insulating material, the process comprising the steps of:
    forming a silicon-containing semiconductor substrate on top of a layer of insulating material disposed on a support layer;
    implanting nitrogen and/or oxygen atoms within the silicon-containing semiconductor substrate; and
    activating the nitrogen and/or oxygen atoms with heat thereby creating an additional layer of insulating material adjacent to the previously formed insulating layer and creating a residual thin silicon containing substrate of a predetermined thickness on top of the additional layer of insulating material.

15. The process according to claim 14, wherein the step of activating the nitrogen and/or oxygen atoms with heat creates a residual layer of silicon-containing semiconductor with a predetermined thickness of between 5 nm to 100 nm.

16. The process according to claim 14, wherein the step of activating the nitrogen and/or oxygen atoms with heat creates a residual layer of silicon-containing semiconductor with a predetermined thickness of between 5 nm to 30 nm.

17. The process according to claim 14, wherein the step of implanting nitrogen and/or oxygen atoms includes implanting nitrogen and/or oxygen atoms with an energy of between a 1 keV and 50 keV.

18. The process according to claim 14, wherein the step of implanting nitrogen and/or oxygen atoms includes implanting nitrogen and/or oxygen atoms with doses of between $10^{17}$ atoms/cm$^2$ and $10^{20}$ atoms/cm$^2$.

19. The process according to claim 14, wherein the step of forming a silicon-containing semiconductor substrate with a given thickness on top of the insulating layer includes forming a silicon-containing semiconductor substrate comprising a single-crystal silicon, polycrystalline silicon, $Si_{1-x}Ge_x$ silicon alloys, where 0<x<1 or $Si_{1-x-y}Ge_xC_y$ silicon alloys, where 0<x<0.95 and 0<y<0.95.

20. A process for fabricating an assembly comprising a silicon-containing semiconductor substrate with a layer of insulating material, the process comprising the steps of:
    forming a silicon-containing semiconductor substrate on top of a layer of insulating material disposed on a support layer;
    implanting an ion species adapted to form an additional layer within the silicon-containing semiconductor substrate; and
    activating the ion species implanted with heat so that the ion species implanted react with silicon-containing semiconductor substrate so as to create an additional layer of insulating material adjacent to the previously formed insulating layer and so as to create a residual thin silicon containing substrate of a predetermined thickness on top of the additional layer of insulating material.

* * * * *

UNITED STATES PATENT AND TRADEMARK OFFICE
CERTIFICATE OF CORRECTION

PATENT NO. : 7,029,991 B2  
APPLICATION NO. : 10/312024  
DATED : April 18, 2006  
INVENTOR(S) : Vincent Le Goascoz et al.

Page 1 of 1

It is certified that error appears in the above-identified patent and that said Letters Patent is hereby corrected as shown below:

Please make the following changes:

Column 7, line 2, from "insulating, material" to - -insulating material- -  
Column 7, line 57, from "where 0<x 1 or" to - -where 0<x<1 or- -

Signed and Sealed this

Twenty-fifth Day of July, 2006

JON W. DUDAS  
*Director of the United States Patent and Trademark Office*